United States Patent
Huang et al.

(10) Patent No.: US 7,316,266 B2
(45) Date of Patent: Jan. 8, 2008

(54) LIQUID-COOLED PIPE

(75) Inventors: Jung-Fong Huang, Sanchong (TW); Chih-Chien Huang, Sansia Township, Taipei County (TW)

(73) Assignee: Forward Electronics Co., Ltd., Taipei (TW)

(*) Notice: Subject to any disclaimer, the term of this patent is extended or adjusted under 35 U.S.C. 154(b) by 497 days.

(21) Appl. No.: 11/088,866

(22) Filed: Mar. 25, 2005

(65) Prior Publication Data

US 2006/0108099 A1    May 25, 2006

(30) Foreign Application Priority Data

Nov. 24, 2004  (TW) .............................. 93218872 U

(51) Int. Cl.
*F28F 9/22*   (2006.01)
(52) U.S. Cl. ...................................... 165/174; 165/150
(58) Field of Classification Search ................ 165/150, 165/173–176; 29/890.052
See application file for complete search history.

(56) References Cited

U.S. PATENT DOCUMENTS

| | | | | |
|---|---|---|---|---|
| 5,097,900 A | * | 3/1992 | Yamaguchi | ................ 165/174 |
| 5,934,366 A | * | 8/1999 | Gowan | ........................ 165/174 |
| 6,056,047 A | * | 5/2000 | Gowan | ........................ 165/174 |
| 6,082,447 A | * | 7/2000 | Insalaco et al. | ............. 165/174 |
| 6,145,589 A | * | 11/2000 | Gowan | ........................ 165/174 |
| 6,766,817 B2 | | 7/2004 | da Silva | ........................ 137/1 |
| 2006/0021746 A1 | * | 2/2006 | Lorentz et al. | ............. 165/174 |

* cited by examiner

*Primary Examiner*—Leonard R Leo
(74) *Attorney, Agent, or Firm*—Bacon & Thomas, PLLC

(57) ABSTRACT

A liquid-cooled pipe for use in a liquid-cooled heat sink kit is disclosed to include a pipe body, which has a close end, an open end, an axial passage extending from the close end to the open end, and a longitudinal series of through holes in the peripheral wall, a plurality of partition members respectively inserted into the axial passage of the pipe body connected in series with the partition plate of one partition member stopped against the legs of next such that each two adjacent partition members define with the pipe body a respective small chamber in fluid communication with two through holes of the pipe body, and an end cover plate fixedly fastened to the pipe body to seal the open end.

6 Claims, 5 Drawing Sheets

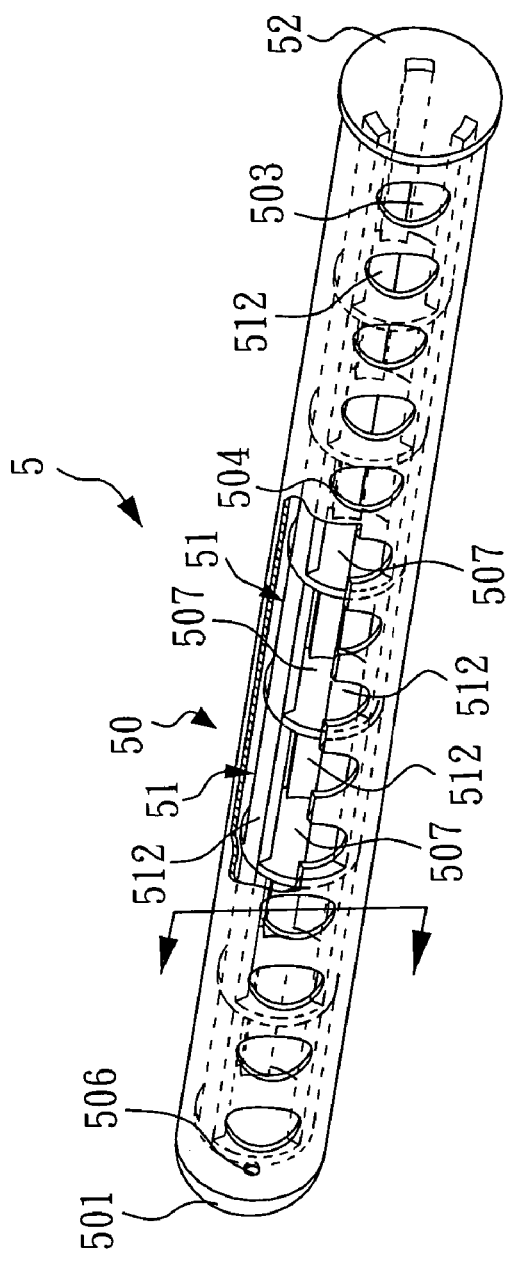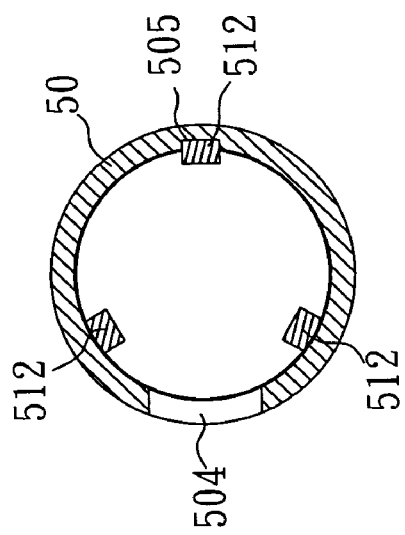
FIG. 5
FIG. 6

LIQUID-COOLED PIPE

BACKGROUND OF THE MENTION

1. Field of the Invention

The present invention relates to a liquid-cooled heat sink kit and more particularly, to a liquid-cooled pipe with internal partition means for use in a liquid-cooled heat sink kit.

2. Description of Related Art

FIG. 1 is an elevational view of a liquid-cooled heat sink kit (liquid-cooled CPU cooler) according to the prior art. Due to the limitation of the turning angles 131 and arrangement of the coiled heat pipe 13 of the heat sink kit 1, the contact area between the radiation fins 11 of the heat sink kit 1 and the heat pipe 13 is reduced. Further, the heat pipe 13 is welded to a metal plate 12 and then the metal plate 12 is fixedly fastened to the radiation fins 11 with screws 14. This heat tube mounting design causes a heat dissipation loss. Therefore, this design of liquid-cooled heat sink kit is not satisfactory in function. In order to improve the drawback of this design of liquid-cooled heat sink kit, a new design of liquid-cooled heat sink kit is developed as shown in FIG. 2.

Referring to FIG. 2, the liquid-cooled heat sink kit 2 comprises a fan 20, radiation fins 23, liquid-cooled pipes 21, partition members 210, and flow-guide pipes 22. The fan 20 is controlled to cause currents of air toward the radiation fins 23 to carry heat away from the flow-guide pipes 22 that is fastened to the radiation fins 23. Because the flow-guide pipes 22 are straight pipes without turning angle, they are arranged on the radiation fins 23 in a high density manner and connected between the liquid-cooled pipes 21, forming with the liquid-cooled pipes 21 a long fluid passage. Therefore, the fluid staying time in the liquid-cooled pipes 21 is greatly increased to enhance cooling effect.

Referring to FIG. 3, each of the aforesaid liquid-cooled pipes 21 has side holes 212 and neck portions 211. Partition members 210 are mounted inside each liquid-cooled pipe 21 and respectively fastened to the neck portions 211. After installation of the partition members 210 in each liquid-cooled pipe 21, the open end of each liquid-cooled pipe 21 is sealed with a copper plate 213 by welding. The fabrication of the liquid-cooled pipes 21 is complicated. During fabrication, the liquid-cooled pipe 21 is rammed to form one neck portion 211, and then side holes 212 are formed in the liquid-cooled pipe 21 in front of the neck portion 211, and then the liquid-cooled pipe 21 is rammed to form another neck portion 211 after cleaning of drilling dust from the side holes 212, and then other side holes 212 are formed in the liquid-cooled pipe 21 between the two neck portions 211, and then the aforesaid procedure is repeated again and again. This complicated processing process greatly increases the manufacturing cost of the liquid-cooled heat sink kit.

SUMMARY OF THE INVENTION

The present invention has been accomplished under the circumstances in view. It is therefore the main object of the present invention to provide a liquid-cooled pipe for liquid-cooled heat sink kit, which is easy and inexpensive to manufacture.

To achieve this and other objects of the present invention, the liquid-cooled pipe comprises a pipe body, a plurality of partition members, and an end cover plate. The pipe body has a close end, an open end, an axial passage surrounded by the peripheral wall thereof and extending from the close end to the open end, and a plurality of through holes formed in the peripheral wall and longitudinally arranged in series at one side. The partition members are respectively mounted in the axial passage of the pipe body, each comprising a partition plate and a plurality of legs respectively perpendicularly extending from one side of the partition plate and equiangular spaced around the periphery. The partition members are connected in series with the partition plate of one partition member stopped against the legs of next such that each two adjacent partition members define with the pipe body a respective small chamber in fluid communication with at least two through holes of the pipe body. The end cover plate is fixedly fastened to the pipe body to seal the open end. The pipe body further comprises a longitudinal groove axially formed on the inner surface of the peripheral wall. Each partition member has a protruding portion axially inserted into the longitudinal groove of the pipe body to prevent rotation of the respective partition member during installation. Further, the pipe body comprises an inside protrusion disposed adjacent to the close end and adapted to stop the first partition member in place. According to the present invention, the processing of the pipe body is simple, and the installation of the partition member in the pipe body is easy, and therefore the invention greatly reduces the manufacturing cost of the liquid-cooled heat pipe.

BRIEF DESCRIPTION OF THE DRAWINGS

FIG. 5 is a perspective assembly view of the liquid-cooled pipe according to the present invention.

FIG. 6 is a cross sectional view in an enlarged scale of FIG. 5.

DETAILED DESCRIPTION OF THE PREFERRED EMBODIMENT

Figure 1:
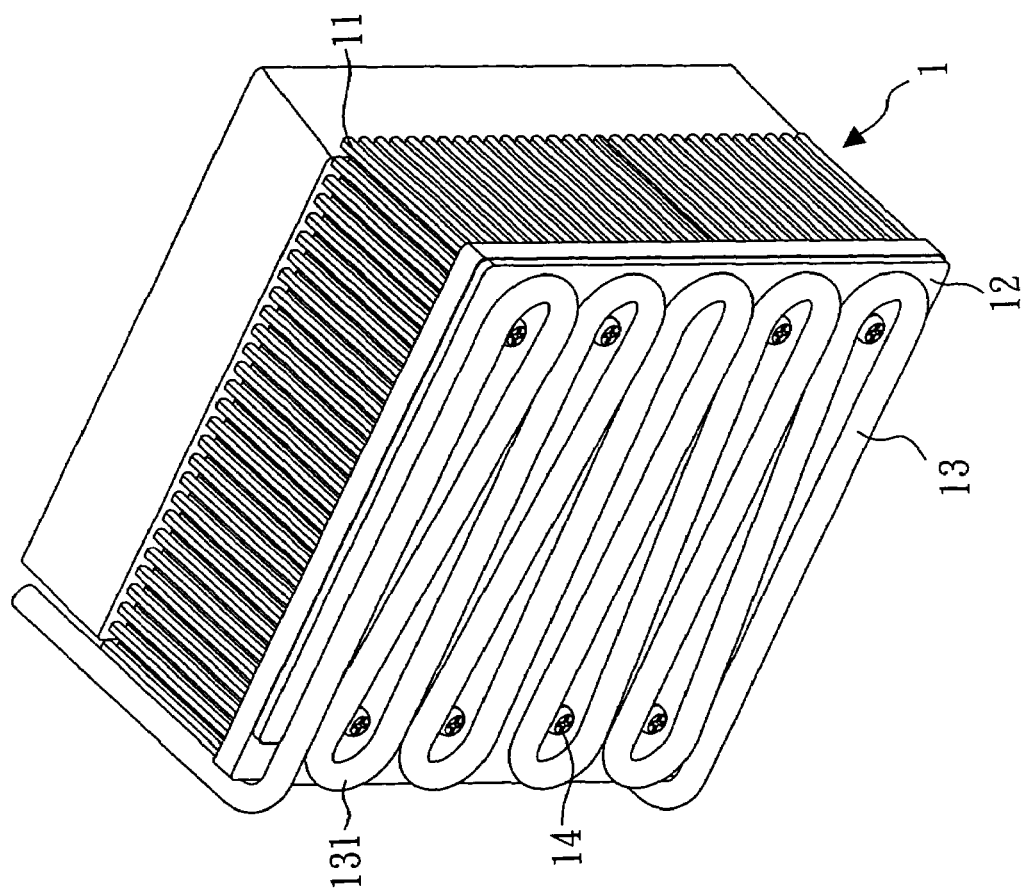
FIG. 1 is an elevational view of a liquid-cooled heat sink kit according to the prior art.
Figure 2:
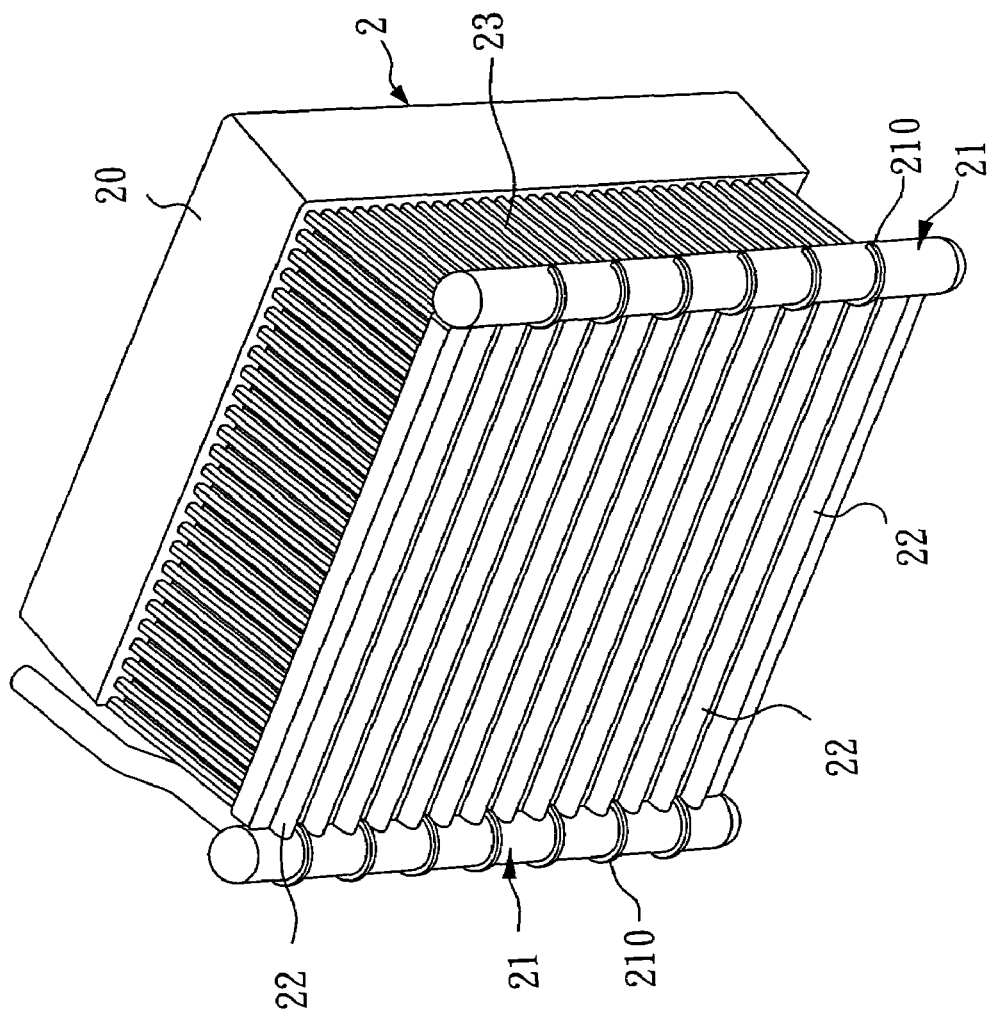
FIG. 2 is an elevational view of another structure of liquid-cooled heat sink kit according to the prior art.
Figure 3:
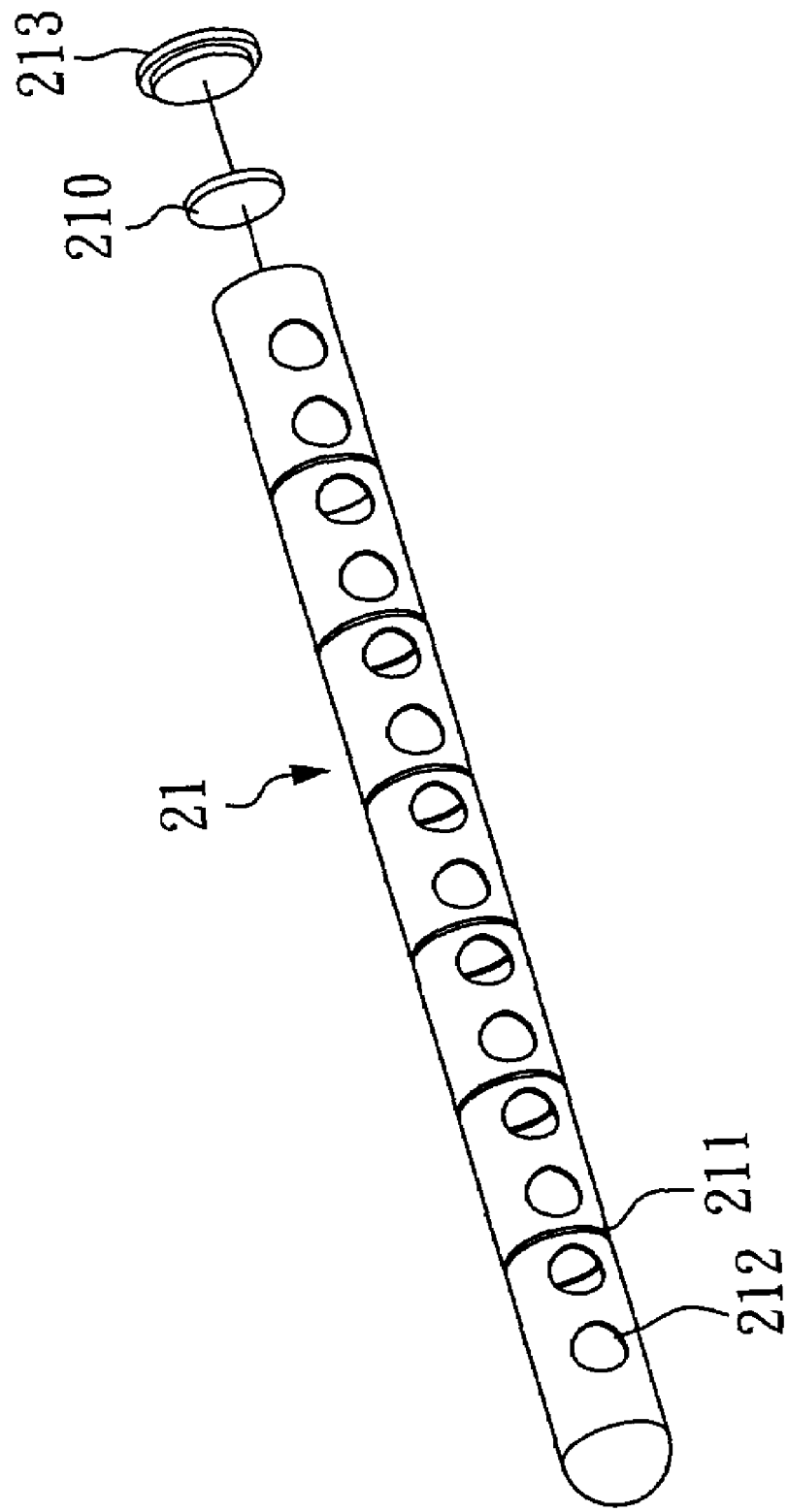
FIG. 3 is an exploded view of a liquid-cooled pipe for the liquid-cooled heat sink kit shown in FIG. 2.
Figure 4:
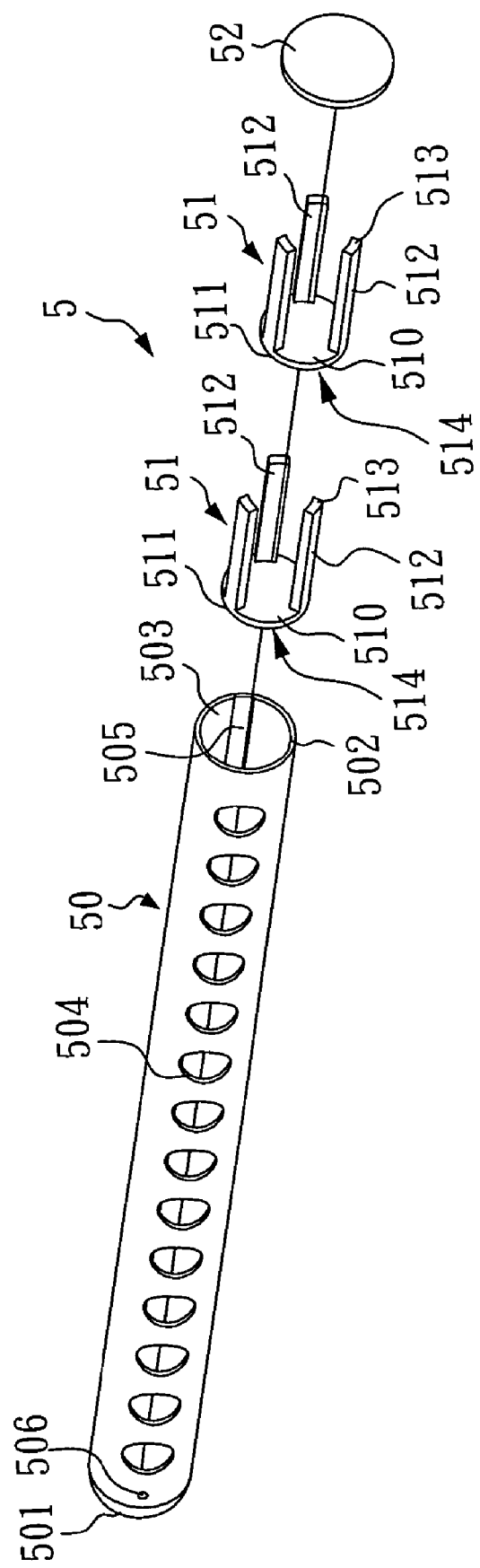
FIG. 4 is an exploded view of a liquid-cooled pipe according to the present invention.

Referring to FIG. 4, a liquid-cooled pipe 5 in accordance with the present invention is shown comprised of a pipe body 50, a plurality of partition members 51, and an end cover plate 52.

The pipe body 50 comprises a first end 501, which is a close end formed by roller-ramming, a second end 502, which is an open end, an axial passage 503 surrounded by the peripheral wall of the pipe body 50 and extending from the first end 501 to the second end 502, and a plurality of through holes 504 formed in the peripheral wall of the pipe body 50 and longitudinally arranged in series at one side. The partition members 51 are respectively mounted inside the axial passage 503 of the pipe body 50, each comprising a partition plate 510 and three legs 512. The legs 512 are respectively perpendicularly extending from one side of the partition plate 510 in flush with the periphery 511 of the partition plate 510. The legs 512 have a predetermined length, and are inserted into the axial passage 503 inside the pipe body 50 in proper order. The end cover plate 52 is fixedly fastened to the pipe body 50 to seal the second end 502.

Referring to FIG. 4 again, the pipe body 50 further comprises a longitudinal groove 505 axially formed in the inside wall thereof. One of the three legs 512 of each partition member 51 has a longitudinally extended rib or protruding portion (not shown) for engaging into the longitudinal groove 505 to prevent rotation of the respective partition member 51 relative to the pipe body 50. The pipe body 50 further comprises an inside protrusion 506 adjacent to the first end for stopping against the front side 514 of the partition plate 510 of the first partition member 51 to hold the first partition member 51 in place.

Referring to FIG. 5 and FIG. 4 again, after installation of the partition members 51 in the pipe body 50 and fixation of the end cover plate 52 to the second end 502 of the pipe body 50, the front side 514 of the partition plate 510 of the partition plate 510 of a posterior partition member 51 is stopped against the rear end 513 of each leg 512 of the partition plate 510 of an anterior partition member 51. Further, the partition plate 510 of each partition member 51 fits the inner wall of the pipe body 50 tightly. When assembled, each two adjacent partition members 51 define with the inner wall of the pipe body 50 a small chamber 507 in communication with at least two of the through holes 504.

Referring to FIG. 6 and FIG. 5 again, the three legs 512 of each partition member 51 are equiangularly spaced around the periphery 511 of the partition plate 510, and one of the three legs 512 of each partition member 51 is inserted into the longitudinal groove 505 of the pipe body 50. Alternatively, each partition member can be made having two symmetrical legs instead of the aforesaid three legs, and one of the two legs of each partition member is inserted into the longitudinal groove of the pipe body.

As indicated above, the manufacturing process of the liquid-cold pipe according to the present invention is simple, therefore the invention effectively reduce the manufacturing cost of the liquid-cold pipe.

According to the aforesaid embodiment of the present invention, the partition members 51 are respectively press-fitted into the inside of the pipe body 50. Alternatively, a phosphor bronze solder rod may be used to solder the partition members 51 to the pipe body 50. When melted, phosphor bronze flows into crevices in between every partition member 51 and the pipe body 50 by means of a capillary effect to fixedly fasten every partition members 51 to the pipe body 50 and to seal the gap.

Although the present invention has been explained in relation to its preferred embodiments, it is to be understood that many other possible modifications and variations can be made without departing from the spirit and scope of the invention as hereinafter claimed.

What is claimed is:

1. A liquid-cooled pipe comprising:
   a pipe body, said pipe body comprising a close end, an open end, an axial passage surrounded by a peripheral wall thereof and extending from said close end to said open end, and a plurality of through holes formed in said peripheral wall and longitudinally arranged in series at one side;
   a plurality of partition members respectively mounted inside said axial passage of said pipe body, each said partition member comprising a partition plate and at least two legs respectively perpendicularly extending from a peripheral edge of said partition plate, said partition members being connected in series inside said pipe body with the partition plate of one of said partition members stopped against the legs of next partition member such that each two adjacent partition members define with said pipe body a respective small chamber in fluid communication with at least two through holes of said pipe body; and
   an end cover plate fixedly fastened to said pipe body to seal said open end.

2. The liquid-cooled pipe as claimed in claim 1, wherein said pipe body further comprises a longitudinal groove axially formed on an inner surface of the peripheral wall of said pipe body; each said partition member has a protruding portion inserted into said longitudinal groove of said pipe body.

3. The liquid-cooled pipe as claimed in claim 2, wherein said protruding portion is formed integral with one of the legs of the respective partition member.

4. The liquid-cooled pipe as claimed in claim 1, wherein the peripheral wall of said pipe body further comprises an inside protrusion disposed adjacent to said close end.

5. The liquid-cooled pipe as claimed in claim 1, wherein said close end of said pipe body is formed by roller-ramming the peripheral wall of said pipe body into shape.

6. The liquid-cooled pipe as claimed in claim 1, wherein the legs of each said partition member are equiangularly spaced around the periphery edge of the partition plate of the respective partition member.

* * * * *